United States Patent [19]

Howell

[11] Patent Number: 4,929,570

[45] Date of Patent: May 29, 1990

[54] SELECTIVE EPITAXY BICMOS PROCESS

[75] Inventor: Paul J. Howell, Federal Way, Wash.

[73] Assignee: National Semiconductor Corporation, Santa Clara, Calif.

[21] Appl. No.: 300,163

[22] Filed: Jan. 19, 1989

Related U.S. Application Data

[63] Continuation-in-part of Ser. No. 239,052, Aug. 29, 1988, abandoned, which is a continuation-in-part of Ser. No. 915,450, Oct. 6, 1986, abandoned.

[51] Int. Cl.⁵ ........................................ H01L 21/265
[52] U.S. Cl. ........................................ 437/89; 437/63; 437/31; 437/33; 437/228; 437/90; 357/43
[58] Field of Search ............... 437/59, 63, 31, 32, 437/33, 225, 228, 241, 90, 89; 156/643, 653, 657; 357/43

[56] References Cited

U.S. PATENT DOCUMENTS

| | | |
|---|---|---|
| 3,955,269 | 5/1976 | Magdo et al. . |
| 4,101,350 | 7/1978 | Possley .................... 437/33 |
| 4,484,388 | 11/1984 | Iwasaki .................... 357/43 |
| 4,507,847 | 4/1985 | Sullivan . |
| 4,536,945 | 8/1985 | Gray et al. . |
| 4,609,568 | 9/1986 | Koh et al. . |
| 4,619,033 | 10/1986 | Jastrzebski . |
| 4,728,624 | 3/1988 | Silvestri et al. ............... 437/225 |
| 4,758,531 | 7/1988 | Beyer .................... 437/90 |
| 4,764,480 | 8/1988 | Vora . |
| 4,820,654 | 4/1989 | Lee .................... 437/90 |

FOREIGN PATENT DOCUMENTS

| | | |
|---|---|---|
| 0227235 | 7/1987 | European Pat. Off. ............... 437/90 |
| 0137647 | 10/1981 | Japan .................... 437/90 |
| 0192346 | 11/1983 | Japan . |
| 0049647 | 3/1985 | Japan . |
| 0022645 | 1/1986 | Japan .................... 437/90 |
| 0154121 | 7/1986 | Japan .................... 437/90 |

OTHER PUBLICATIONS

Anantha et al, IBM TDB, vol. 16, No. 10, Mar. 1974, p. 3245.
Higuchi et al, IEDM Tech. Digest (1984), pp. 694–697.
Ting, IEDM Tech. Digest, (1984), pp. 110–113.
Ghandhi, S. K., "VLSI Fabrication Principles", (1983), pp. 604–611, 616–623, 214–215.

Primary Examiner—Brian E. Hearn
Assistant Examiner—Kevin McAndrews
Attorney, Agent, or Firm—Lee Patch; Robert C. Colwell; Vern Norviel

[57] ABSTRACT

A process for fabricating both bipolar and complementary field effect transistors in an integrated circuit is disclosed. The process begins with a structure having a P type substrate 10, an N type epitaxial layer 15, and an intervening N type buried layer 12. The process includes the steps of removing all of the epitaxial layer 15 and all of the buried layer 12 from regions of the substrate where NMOS devices are to be formed, to thereby leave second regions of the epitaxial layer 15 and buried layer 12 having sidewalls 21 protruding above the substrate 10. A layer of silicon dioxide 25 is formed at least over the sidewalls of the protruding regions, and then a further epitaxial deposition of silicon is employed to reform the epitaxial layer 28 over the first regions, which epitaxial layer 28 is separated from the previously formed epitaxial layer 15 by the silicon dioxide isolation 25. The process continues by fabricating bipolar and field effect transistors in separate ones of the first and second regions.

24 Claims, 2 Drawing Sheets

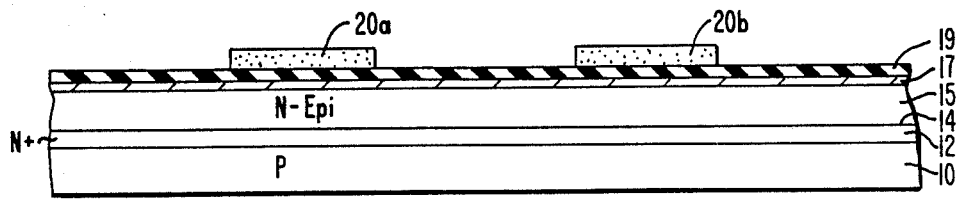
FIG._1.
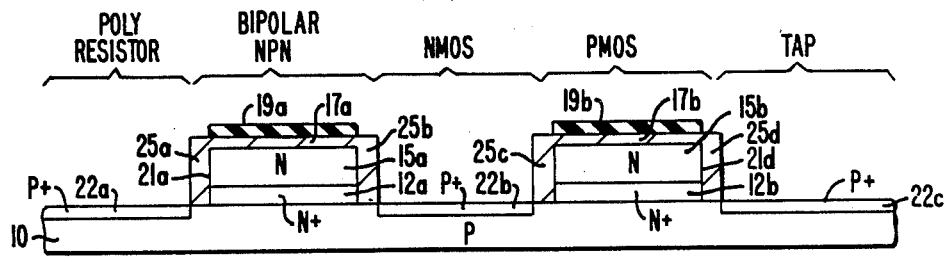
FIG._2.
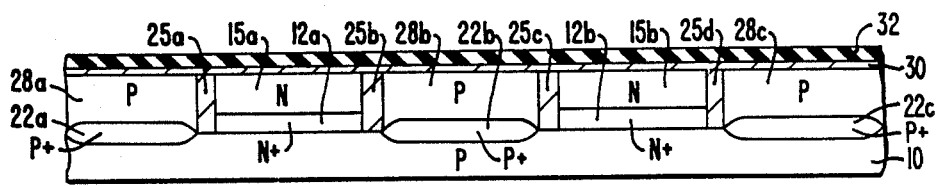
FIG._3.
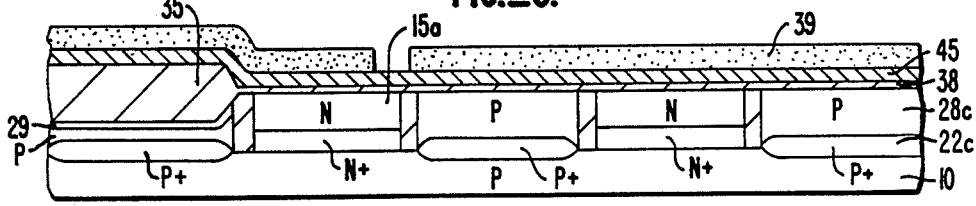
FIG._4.
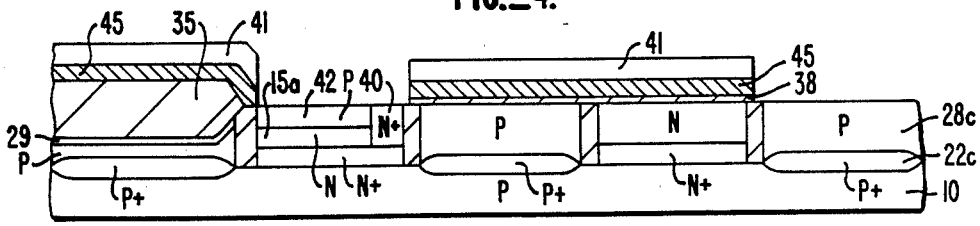
FIG._5.

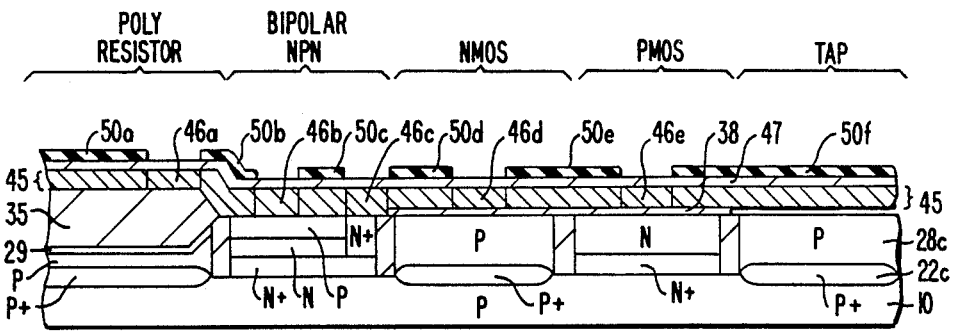
FIG._6.
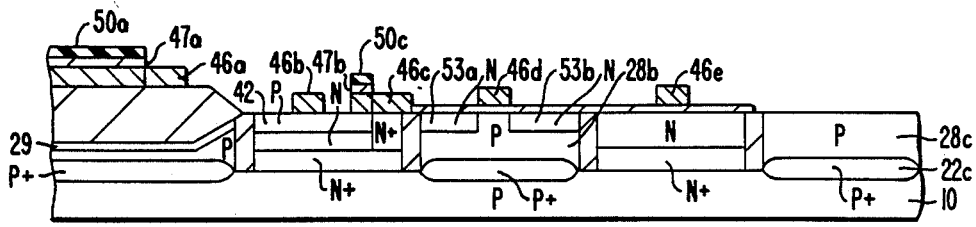
FIG._7.
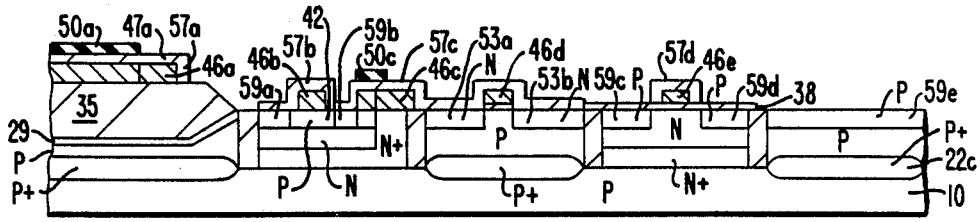
FIG._8.
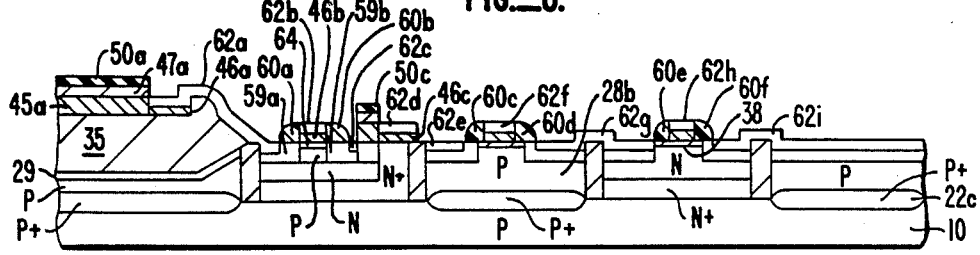
FIG._9.
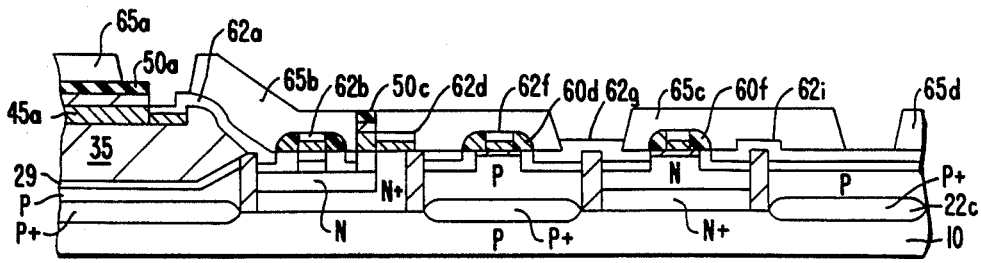
FIG._10.

SELECTIVE EPITAXY BICMOS PROCESS

This is a continuation of application Ser. No. 239,052, filed Aug. 29, 1988, now abandoned, which is a continuation of Ser. No. 915450, 10/6/86, now abandoned.

BACKGROUND OF THE INVENTION

1. Field of the Invention

This invention relates to processes for fabricating integrated circuits, and to processes for fabricating both bipolar and complementary field effect transistors in the same substrate. In particular, the invention relates to a BiCMOS process in which selective formation of an epitaxial layer is employed to isolate individual bipolar and CMOS transistors, as well as other components.

2. Description of the Prior Art

Bipolar and CMOS technologies have each been independently understood for many years. Recently, however, the ability to combine CMOS with bipolar on the same integrated circuit has raised new possibilities for very large scale integration. For example, bipolar output drivers may be employed with CMOS memories to provide more drive current. Because normally MOS circuits operate slower with increasing temperature, while bipolar operates faster, a CMOS bipolar combination may be employed to make devices less speed sensitive to temperature. In addition, combining high performance bipolar devices with MOS transistors on the same integrated circuit allows a combination of the high-packing density of MOS devices and permits the ability to integrate complex functions with high yields. The CMOS circuits have inherently low power requirements, while the bipolar devices have an advantage in switching speed and current drive per unit area.

Accordingly, much effort has been devoted by process scientists and engineers toward methods of integrating bipolar and CMOS processes on a single wafer. Unfortunately, such processes are generally not optimized for either the CMOS aspect or the bipolar aspect, consisting instead of a brute force combination of the steps required to fabricate each type device with all of its associated process steps. The result is a lengthy and complicated process using a large number of masking operations, which is vulnerable to lower yields as a result of the complexity of the process.

Most such prior art processes are basically either a CMOS or a bipolar process, that is, the CMOS process provides little for the ad hoc bipolar devices as they end up being built from CMOS spare parts and display lackluster performance. As a result, the compromised technology cannot compete on its own against processes optimized for either of the constituent bipolar or CMOS devices. Typical prior art bipolar-CMOS processes may be found in U.S. Pat. No. 4,484,388 to Iwasaki; U.S. Pat. No. 4,507,847 to Sullivan; and U.S. Pat. No. 4,536,945 to Gray et al.; and U.S. Pat. No. 3,955,269 to Magdo et al.

SUMMARY OF THE INVENTION

The BiCMOS process of my invention provides high performance bipolar and CMOS devices. By employing selective epitaxy, self-aligned complementary silicon regions are formed, thereby reducing mask count. Furthermore, the process strongly decouples the bipolar and CMOS devices.

By selectively growing epitaxial silicon after an anisotropic etch through a previously formed epitaxial layer and buried layer, self-aligned active regions of opposite conductivity type with individual buried layers are formed. These "islands" are separated from each other by a thin film of silicon dioxide, rather than a photolithographic dimension. This aspect of the process may be performed using a single mask, and enables all active regions to rest on buried layers of appropriate conductivity type, thereby suppressing parasitic bipolar transistors and latchup. Traditional isolation schemes require multiple masks, and corresponding alignment tolerances, to achieve the same result.

In my process, the determination of whether a given silicon island in my process will become a bipolar device or an MOS device is determined by a technology mask. In a preferred embodiment the technology mask consists of a mask which determines whether previously-formed gate oxide is etched away or allowed to remain in place. When the gate oxide is etched away, a subsequent layer of polycrystalline silicon directly contacts the epitaxial layer to form the bipolar emitter contact. When the gate oxide is not removed, the subsequent polycrystalline silicon forms the gate electrode of the field effect device.

In a preferred embodiment the process begins with a structure which includes a semiconductor substrate of first conductivity type, an epitaxial layer of second conductivity type, and a buried layer also of second conductivity type separating the substrate from the epitaxial layer. The process then includes the steps of removing all of the epitaxial layer and all of the buried layer from first regions where first channel type field effect transistors are desired to thereby leave second regions of the epitaxial layer and buried layer having sidewalls protruding above the substrate. A thin layer of silicon dioxide, or other suitable insulating material, is then formed over the sidewalls of the second regions, followed by a step of depositing additional epitaxial silicon over at least the first regions to thereby reform the epitaxial layer over those first regions. As a result of this step the epitaxial layer in the second region is separated from the epitaxial layer in the first region by the thin film of insulating material. Finally, bipolar and field effect transistors, as well as other desired components, are formed in the first and second regions using semiconductor fabrication processes described below.

BRIEF DESCRIPTION OF THE DRAWINGS

FIG. 1 is a cross-sectional view of a semiconductor structure after fabrications of a buried layer, an epitaxial layer, and an oxidation barrier;

FIG. 2 is a subsequent cross-sectional view after selective etching of the epitaxial layer to remove it and the buried layer from first regions, and formation of insulating material on the sidewalls of the remaining regions;

FIG. 3 is a subsequent cross-sectional view after redepositing the epitaxial layer in the first regions and redefining the barrier;

FIG. 4 is a subsequent cross-sectional view after formation of field oxide regions;

FIG. 5 is a subsequent cross-sectional view after formation of a collector contact and an intrinsic base of the bipolar devices;

FIG. 6 is a subsequent cross-sectional view after deposition and additional doping of polycrystalline silicon;

FIG. 7 is a subsequent cross-sectional view after definition of the bipolar emitter contacts and MOS gates as well as all polysilicon regions;

FIG. 8 is a subsequent cross-sectional view after doping of all source/drain regions;

FIG. 9 is a subsequent cross-sectional view after formation of silicide contacts to desired regions; and FIG. 10 is a subsequent cross-sectional view after preparation for fabrication of additional electrical contacts.

DETAILED DESCRIPTION OF THE PREFERRED EMBODIMENTS

FIG. 1 is a cross-sectional view of a semiconductor structure fabricated using well known process operations beginning with a wafer 10. As shown in FIG. 1, a blanket implant of a buried layer 12 is made into the P conductivity type silicon substrate 10. The resistivity of the substrate is on the order of 10–20 ohm centimeters, while the buried layer is implanted with arsenic with a concentration of approximately $3-5 \times 10^{15}$ atoms per square centimeter. Following the implant the structure is annealed, for example, at 1100° C. for 60 minutes. On the upper surface 14 of the substrate 10, an epitaxial layer 15 is formed using a conventional process. Epitaxial layer 15 is doped lightly with N conductivity type impurity and is about 1.2 microns thick.

On the upper surface of epitaxial layer 15, a relatively thin layer of silicon dioxide 17 is formed, for example, by thermal oxidation. Finally, on the upper surface of silicon dioxide 17, a layer of silicon nitride 19 is deposited, for example, using chemical vapor deposition. In the preferred embodiment silicon dioxide 17 is approximately 250 Angstroms thick, while silicon nitride 19 is approximately 1500 Angstroms thick.

In other embodiments of the invention, the conductivity types of the enumerated regions 10, 12, and 15, may be reversed. The described process, however, is preferred because of the difficulty of controlling P conductivity type impurity diffusions during the formation of the epitaxial layer (and its reformation described below).

After formation of the nitride layer 19, a masking layer 20, typically photoresist, is deposited across the upper surface of the silicon nitride 19, and using well known photolithographic techniques, a mask 20a, 20b, is defined to expose those regions of the silicon nitride to be removed. In the embodiment depicted the regions of nitride to be removed correspond to the regions of the epitaxial layer to be removed, primarily the locations of the NMOS devices, but also the locations for polysilicon resistors and substrate taps. Then, using conventional semiconductor fabrication processes, silicon nitride layer 19 is removed except where protected by the mask 20. Similarly, the underlying and thereby exposed regions of silicon dioxide 17 are removed. Because layers 17, 19 are relatively thin, either wet or dry (plasma) processes may be employed to remove them.

As next illustrated by FIG. 2, the etching process is continued to remove all of the thereby exposed epitaxial layer 15 and underlying buried layer 12. Typically, the interface of buried layer 12 with substrate 10 is approximately 2 microns beneath the surface of substrate 10, assuming a 1.2-micron-thick epitaxial layer 15. The removal of the epitaxial layer 15 and buried layer 12 is preferably accomplished using an anisotropic etching process. In this manner an essentially vertical cut is made through the layers with minimal lateral etching beneath the protective silicon nitride caps 19a and 19b. As a result of this process, regions of the epitaxial layer and buried layer having sidewalls 21 protrude above the substrate 10. To assure complete removal of the buried layer, the reactive ion etch of the silicon 15, 12 and 10 is allowed to remove approximately 2.5 microns of silicon beneath the upper surface of the epitaxial layer 15. Viewed from the top, the resulting islands will be rectangular (usually) with width and height of appropriate dimension for the formation of a transistor.

In the preferred embodiment the structure is next oxidized by heating it in steam to approximately 1000° C. for 70 minutes. This process forms about 5,000 Angstroms of silicon dioxide over the exposed upper surface of substrate 10 and over the sidewalls 21 of the protruding islands of buried layer 12 and epitaxial layer 15. In an alternative embodiment silicon dioxide layer 25 may be applied using a low temperature process such as chemical vapor deposition.

Reactive ion-etching is then used to remove the silicon dioxide from the surface of substrate 10. By virtue of the anisotropic nature of the process, silicon dioxide is removed from this surface without significantly removing it from the sidewalls 21 of the protruding silicon regions 12 and 15. As a final step to achieve the structure shown in FIG. 2, a P conductivity type implant, also masked by the nitride 19 and oxide 25, provides a buried layer 22. The implant is annealed for about 60 minutes at 950° C. Buried layer 22 destroys any lateral current path from one region of the epitaxial silicon to an adjoining region. The buried layer guarantees that any parasitic bipolar transistor formed by the source/drain (parasitic emitter) through the epitaxial layer (parasitic base) to an adjacent well will have a very low beta. Such a buried layer thus effectively suppresses latchup in the CMOS structures to be formed by later process operations.

The appearance of the structure following implanting of regions 22 is shown in FIG. 2. Across the upper portion of FIG. 2, regions of the structure are labeled to describe the component which will be formed therein. For example, from left to right in the middle of the structure, an NPN bipolar transistor will be formed adjacent an N channel MOS transistor, in turn adjacent a P channel MOS transistor. A substrate tap will be formed at the right side of the structure, while the resistor will be formed at the left side.

The structure shown in FIG. 2 then is introduced into an epitaxial reactor, and a further layer of epitaxial silicon 28 deposited (see FIG. 3). The silicon dioxide protective layers 17 and 25 prevent epitaxial silicon from forming upon the upper surface of the protruding regions. By careful control of the epitaxial process the upper surface of the new epitaxial regions 28 will be substantially planar with the upper surface of the previously-formed epitaxial regions 15. After formation of the new epitaxial layer, the silicon nitride 19 and silicon dioxide 17 are removed from the surface of the structure using conventional etchants. In the event that the upper surface of the separately formed epitaxial regions 28 are not sufficiently planar to regions 15, a sacrificial oxidation may be employed by which the upper surface is oxidized, and the resulting silicon dioxide removed, also using the conventional etching technology.

As also shown in FIG. 3, a new layer of silicon dioxide 30 approximately 250 Angstroms thick then is formed by heating the structure to a temperature of 1000° C. for 20 minutes. Then another layer of silicon nitride 32 approximately 1100 Angstroms thick is deposited on silicon dioxide 30, using conventional chemical vapor deposition. During the formation of the epitaxial layer 28 and the formation of silicon dioxide 30, the P conductivity type regions 22 will diffuse outward, thereby extending upward into the epitaxial layer 28. In the preferred embodiment the newly-formed regions of epitaxial silicon 28a, 28b, and 28c will be lightly doped with P conductivity type impurity, for example, boron, and will have an impurity concentration on the order of $1 \times 10^{17}$ atoms per cubic centimeter.

Next, another mask (not shown) is formed across the upper surface of nitride 32 to define those regions where field oxide is desired. In one embodiment of the invention the field oxide is formed wherever a polysilicon resistor is desired. Thus, the mask is removed from the surface of the structure above epitaxial region 28a, and allowed to remain everywhere else. Again, using conventional etching technology, the exposed portions of silicon nitride 32 and silicon dioxide 30 are removed. Before oxidizing the epitaxial layer, a channel stop 29 may be implanted, if desired. The channel stop 29 prevents the formation of parasitic N channels beneath the silicon dioxide isolation regions. Typically, boron is implanted with a dose of $1 \times 10^{13}$ at 50 KeV using the resist as a mask. Then the implant is annealed at about 900° C. for 30 minutes. The structure then is oxidized in steam at a temperature of 1000° C. for about 70 minutes to form approximately 5,000 Angstroms of field oxidation 35 (shown in FIG. 4). The field oxide 35 will decouple the later-formed overlying polysilicon resistor from the epitaxial region 28a. Field oxide 35 will also provide insulation for overlying electrical connections. Use of the relatively thick oxide 35 in this manner avoids possible shorts to the epitaxial layer which occur when thinner oxide is employed. Furthermore, the thick oxide 35 decouples such conducting lines from the substrate.

After formation of field oxide 35, the remaining regions of silicon nitride 32 and silicon dioxide 30 are stripped from the surface of the structure and a thin layer of gate oxide 38 is formed. Silicon dioxide 38 typically is about 200 Angstroms thick and formed by heating the structure to a temperature of 950° C. for 20 minutes in an oxidizing ambient. The gate oxide will separate the gate electrodes of the MOS devices from the epitaxial layer.

After formation of gate oxide 38, in the preferred embodiment a thin (about 500 Angstroms) layer of polycrystalline silicon may be deposited. This is optional to my process, because if desired all of the polysilicon may be deposited later. If employed, the polysilicon protects the gate oxide from subsequently formed photoresist, patterning, and annealing. Then a mask 39 is formed across the upper surface of the structure and openings are provided, using well known photolithographic techniques, wherever a contact (collector sink) to the buried collector of a bipolar device is desired. One such opening in the mask 39 over region 15a is illustrated.

As shown in FIG. 5, a high energy implant of N conductivity type impurity, typically phosphorus, then defines a collector sink 40. In the preferred embodiment, the implant has a dosage of approximately $2 \times 10^{15}$ atoms per square centimeter and an energy of 180 KeV. Mask 39 protects the remainder of the silicon. The mask is then stripped and the collector sink annealed for about 60 minutes at about 1000° C.

After forming the collector sink, a "technology" mask 41 is defined across the upper surface of the structure. As shown in FIG. 5, openings are made in the mask 41 wherever bipolar devices are desired, for example, above all of epitaxial region 15a. Additionally, in the preferred embodiment of my process, openings are made in mask 41 wherever substrate taps are desired, e.g., above epitaxial region 28c.

The exposed regions of the thin layer of polysilicon 45 are then etched away using well known processes. The thereby exposed gate oxide 38 is allowed to remain on the surface of the epitaxial layer. The intrinsic base 42 of the bipolar transistor then is implanted through the gate oxide with P conductivity type impurity. In the preferred embodiment a concentration of $1 \times 10^{13}$ atoms per square centimeter of boron are employed at an energy of 40 KeV. Advantageously, the base implant also dopes the substrate tap more P-type. The exposed gate oxide 38 is then etched off using a suitable wet etch and the structure then is annealed by heating it to a temperature of 900° C. for 30 minutes to repair any dislocations caused by the collector sink and the base implantations. During this process the gate oxide beneath resist 41 will not grow thicker.

The next steps of the process are described in conjunction with FIG. 6. A layer of polycrystalline 45, or the necessary remaining thickness for the earlier deposited polysilicon, is deposited across the entire upper surface of the structure, and then a blanket implant of N conductivity type impurity is introduced to achieve the desired resistivity for the resistors, such as will be formed over field oxide 35. In the preferred embodiment, polysilicon 45 is 4500 Angstroms thick and is deposited using chemical vapor deposition. The structure then is heated in an oxygen ambient to form silicon dioxide 47 across the upper surface of polycrystalline silicon 45. Silicon dioxide 47 will be on the order of 200 to 400 Angstroms thick. Next, approximately 1,500 Angstroms of silicon nitride 50 are deposited across the upper surface of silicon dioxide 47. Using conventional photolithographic and etching techniques, silicon nitride is defined into regions 50a–50f as shown in FIG. 6. The silicon dioxide 47 provides an etch stop for the removal of the undesired silicon nitride. The silicon nitride not only protects the polycrystalline silicon from a subsequent implant which defines the gates and emitter regions, but also protects the polysilicon 45 from oxidation in a subsequent process step.

Once the silicon nitride 50 is suitably patterned, a strong implant of N conductivity type impurity, typically $1 \times 10^{16}$ atoms per square centimeter of arsenic, dopes the unprotected regions of the polysilicon 45. The strongly doped regions provide a resistor contact 46a, an emitter contact 46b, a collector sink contact 46c, an N channel gate electrode 46d, and a P channel gate electrode 46e.

After implantation of the polysilicon 46, another masking layer is defined to protect all of the regions of the structure where polysilicon is to remain. Thus, as shown in FIG. 7, such a mask protects all of regions 50a, 46a, 46b, 50c, 46c, 46d and 46e. The undesired polycrystalline silicon then is etched away, preferably using reactive ion etching to leave the structure in the form depicted in FIG. 7. A small region of polycrystalline silicon beneath nitride 50c remains adjoining collector sink contact 45c. This small region acts as a spacer and prevents the extrinsic base dopant from being placed next to the collector sink, which would create a structure with a low breakdown voltage and a high capacitance PN junction where the extrinsic base would otherwise join the collector sink.

Another mask then is formed across the upper surface of the structure to protect the structure except where sources and drains of the NMOS device are desired, i.e., not overlying region 28b of the epitaxial layer. A heavy N conductivity type implant then creates source/drain regions 53a, 53b. In the preferred embodiment the impurity comprises arsenic and is implanted to a concentration of $5 \times 10^{15}$ atoms per square centimeter with an energy of 100 KeV. The structure then is annealed by heating it to a temperature of 950° C. for 30 minutes. During this annealing N-type impurity in the emitter contact 46b diffuses out of the contact and into the epitaxial layer 42 to dope the emitter region 64. If a lightly-doped drain device is desired, then the N type implant will be lighter than the normal dose, with a heavier dose applied later in the process, for example, as described in conjunction with FIG. 9. Alternatively, a double implant may be employed with two impurities having different diffusivities, for example, phosphorus and arsenic. The phosphorus will diffuse into the structure ahead of the arsenic, thereby forming a lightly doped drain structure.

As shown in FIG. 8, as a result of the annealing a layer of silicon dioxide 57 forms over the exposed polycrystalline silicon. Because N conductivity type silicon oxidizes faster than P type, the layer of silicon dioxide 57 is thicker over the N type regions than over the P type regions. Thus, silicon dioxide region 57b is thicker over the N type polysilicon emitter contact 46b than over the underlying extrinsic base 42. Relying upon the differential oxide thickness, a blanket implant of boron at low energy dopes the source/drain regions 59c, 59d, of the PMOS device, the extrinsic base 59a, 59b, of the bipolar device, and the substrate tap 59e, while the differential oxide thickness prevents the impurity from significantly affecting the impurity doping of the regions beneath the thicker oxide. In the preferred embodiment, the P type dopant is boron implanted with $3 \times 10^{15}$ atoms per square centimeter at an energy of about 30 KeV. This is sufficient to penetrate the thin oxide 38 but not the thicker oxide 57.

A relatively thick layer of silicon dioxide then is deposited across the upper surface of the structure shown in FIG. 8 and anisotropically etched to form the spacer oxide regions 60a–60f shown in FIG. 9. In the preferred embodiment, the reactive ion etch may be performed using an end point detector. After the anisotropic etch, to assure complete removal of the thin oxide from the surface of the silicon, the structure may be dipped in hydrofluoric acid. If lightly doped drain structures are desired, an additional mask is formed across the surface of the semiconductor structure to expose only the NMOS devices. This mask, together with the spacer oxide 60c and 60d, will mask an additional implant of N type impurity to heavily dope the regions of the NMOS source and drain spaced apart from the gate.

Next, a layer of silicide-forming metal is deposited across the entire upper surface of the structure and reacted with the underlying silicon. As a result, regions of metal silicide 62 are formed across the upper surface of the structure as shown in FIG. 9. In the preferred embodiment the metal comprises titanium, and the step of reacting it with the silicon consists of heating the structure to a temperature of 800° C. in a neutral ambient for about 15 minutes. The silicon nitride regions 50a and 50c prevent the silicide from shorting the polysilicon resistor formed on field oxide 35 and from shorting the collector contact 46c to the extrinsic base 59b. After formation of the silicide, the structure is masked to define local interconnections between the various component parts, and any unreacted titanium is removed using ammonium hydroxide and hydrogen peroxide etchants.

As shown in FIG. 9, the remaining silicide regions provide interconnections among the various transistor components, as well as interconnections to the associated resistor and substrate connection. Specifically, silicide region 62a connects one electrode 46a of resistor 45a to the base 59a of the NPN transistor. Silicide 62b connects to the emitter 65 which is formed by N-type impurity diffusing out of polysilicon region 46b, during the formation of titanium silicide. Another region of titanium silicide 62c lowers the resistance of the extrinsic base. Silicide 62e is a connection to one of the source/drain of the NMOS device, while silicide 62g shorts the other of the source/drain to one of the source/drain of the PMOS device. Metal silicide 62f provides a low resistance connection to the gate of the NMOS device, while silicide region 62h provides a similar connection to the gate of the PMOS device. One of the source/drain of the PMOS device is shorted to the substrate by silicide 62i.

Following formation of the structure shown in FIG. 9, silicon dioxide 65 is deposited across the surface as shown in FIG. 10. Silicon dioxide 65 is masked and regions of silicon dioxide 65 are removed wherever electrical connections to the underlying silicide are desired. The resulting structure is shown in FIG. 10 before formation of such metal connections. The use of metal silicide as a local interconnection allows the formation of very small source/drain regions and extrinsic base regions to which electrical connections may be made on field oxide.

The process described above results in the fabrication of bipolar transistors having very low parasitic capacitance. The collectors of the bipolar devices are fully isolated on their periphery by silicon dioxide which reduces the capacitance between the collector and the substrate. This is a substantial advantage over existing processes in which the lateral component of the collector-substrate capacitance dominates over the vertical component for minimum geometry transistors. The self-aligned local interconnection system formed by the metal silicide allows base area to be minimized, thereby reducing base-collector capacitance. The low capacitance allows high switching frequencies.

Despite the necessity that the sink be formed in the same epitaxial region as the rest of the bipolar transistor, (because the collector cannot extend beneath the trenches of silicon dioxide isolating the islands of the epitaxial layer) capacitance between the collector and the base is minimized by the structural layout depicted in the figures.

With respect to the field effect devices, the employment of selective oxidation, i.e., reliance upon the different oxidation rates of N and P type silicon, minimizes masking operations. Because buried layers are provided under both the N and P channel transistors, there is no lateral current path available, thereby minimizing latchup. The silicide source/drain regions lower contact resistance and minimize area by allowing remote connections to the field effect devices, thereby improving performance. Furthermore, because the doping of the P epitaxial layer is effectively decoupled from other process considerations, it may be optimized to suit the desired performance of the N channel devices. In essence, the performance of each of the bipolar and CMOS devices may be appropriately controlled to obtain maximum performance from each without compromising either to suit the fabrication of the other.

The preceding has been a description of the preferred embodiment of the process of my invention. While specific times, temperatures, and process details have been provided to fully describe particular embodiments of the invention, these details are not intended to limit the invention. The scope of the invention may be determined from the appended claims.

I claim:

1. In a structure having a semiconductor substrate of first conductivity type, an epitaxial layer of second conductivity type, and a buried layer of second conductivity type separating the substrate from the epitaxial layer, a method of fabricating both bipolar and field effect transistors comprising:
   (a) removing all of the epitaxial layer and all of the buried layer from first regions where first channel type field effect transistors are desired to thereby leave second regions of the epitaxial layer and buried layer having sidewalls protruding above the substrate, said step of removing further comprising the steps of:
     (i) masking the second regions of the epitaxial layer with an etch-resistant material by forming a first layer of silicon dioxide on the epitaxial layer and a layer of silicon nitride on the silicon dioxide; and
     (ii) etching the epitaxial layer and the buried layer to expose the substrate in the first regions;
   (b) forming a layer of insulating material at least over the sidewalls of the second regions;
   (c) depositing semiconductor material over at least the first regions to thereby reform the epitaxial layer over the first regions, the epitaxial layer in the second regions being separated from the epitaxial layer in the first regions by the insulating material;
   (d) implanting first conductivity type impurity into the first regions, the second regions being protected by the layer of silicon nitride; and
   (e) forming at least one first channel type field effect transistor in one of the first regions and one bipolar transistor in one of the second regions.

2. A method as in claim 1 wherein the step of etching comprises reactive ion etching.

3. A method as in claim 1 wherein each of the substrate and the epitaxial layer comprise silicon.

4. A method as in claim 3 wherein the step of forming a layer of insulating material comprises oxidizing at least the sidewalls of the second regions to form silicon dioxide.

5. A method as in claim 4 wherein the step of forming a layer of insulating material is followed by a step of etching the insulating material from the first regions except at a periphery thereof.

6. A method as in claim 1 wherein the step of forming a layer of insulating material comprises depositing silicon dioxide using chemical vapor deposition.

7. A method as in claim 6 wherein the step of forming a layer of insulating material is followed by a step of etching the insulating material from the first regions.

8. A method as in claim 7 wherein the step of etching the insulating material is followed by a step of implanting first conductivity type impurity into the first regions, the second regions being protected by the silicon nitride mask.

9. A method as in claim 1 wherein the step of forming bipolar and field effect transistors comprises oxidizing the epitaxial layer in both the first and second regions to form a layer of oxide, said oxide layer forming a layer of gate oxide in regions where field effect transistors are to be formed.

10. A method as in claim 9 wherein the step of oxidizing the epitaxial layer is followed by a step of defining polycrystalline silicon gate electrodes on the gate oxide.

11. A method as in claim 10 wherein the step of defining polycrystalline silicon gate electrodes is followed by a step of using the polycrystalline silicon gate electrodes as a mask to implant sources and drains of the field effect transistors.

12. A method as in claim 11 wherein following the step of using the polycrystalline silicon gate electrodes as a mask, a step of forming silicon dioxide spacer regions on sides of the gate electrodes is performed.

13. A method as in claim 12 wherein following the step of forming the spacer regions, a step of applying a silicide-forming metal to the structure is performed.

14. A method as in claim 12 wherein the step of forming silicon dioxide spacer regions comprises:
   oxidizing the semiconductor structure; and
   anisotropically etching the structure to remove the thereby formed silicon dioxide from the structure except from the spacer regions.

15. A method as in claim 1 wherein the step of forming bipolar and field effect transistors comprises forming a collector sink extending to the buried layer in a second region.

16. A method as in claim 15 wherein the step of forming a collector sink is followed by a step of implanting a base region of the bipolar transistor into the second region.

17. A method as in claim 16 wherein the step of implanting a base region is followed by a step of defining a polycrystalline silicon emitter contact to the bipolar transistor.

18. A method as in claim 1 wherein the step of forming bipolar and field effect transistors further comprises forming resistors.

19. A method as in claim 18 wherein the step of forming resistors comprises oxidizing one of the first or second regions to form a field oxide region.

20. A method as in claim 19 wherein the step of oxidizing one of the first or second regions is followed by the step of depositing polycrystalline silicon on the field oxide region.

21. In a structure having a P conductivity type silicon substrate, an N conductivity type epitaxial layer, and an N conductivity type buried layer separating the substrate from the epitaxial layer, a method of fabricating both bipolar and field effect transistors comprising:
   removing all of the epitaxial layer and all of the buried layer from first regions where first channel type field effect transistors are desired to thereby leave second regions of the epitaxial layer and buried layer having sidewalls protruding above the substrate;
   oxidizing at least the sidewalls of the second regions to form silicon dioxide;

implanting P type impurity into the substrate in the first regions to form a P conductivity type buried layer in the first regions;

depositing silicon over at least the first regions to thereby reform the epitaxial layer over the first regions, the epitaxial layer in the second regions being separated from the epitaxial layer in the first regions by the silicon dioxide; and forming bipolar transistors in the second regions and field effect transistors in each of the first and second regions.

22. The method as recited in claim 1 further comprising the step of forming a second channel type field effect transistor in one of said second regions.

23. In a structure having a semiconductor substrate of first conductivity type, an epitaxial layer of second conductivity type, and a buried layer of second conductivity type separating the substrate from the epitaxial layer, a method of fabricating both bipolar and field effect transistors comprising:

removing all of the epitaxial layer and all of the buried layer from first regions where first channel type field effect transistors are desired to thereby leave second regions of the epitaxial layer and buried layer having sidewalls protruding above the substrate;

forming a layer of insulating material at least over the sidewalls of the second regions;

depositing semiconductor material over at least the first regions to thereby reform the epitaxial layer over the first regions, the epitaxial layer in the second regions being separated from the epitaxial layer in the first regions by the insulating material;

forming at least one bipolar, one field effect transistor and one resistor in the first and the second regions, the step of forming a resistor further comprising the step of oxidizing one of the first or second regions to form a field oxide region;

depositing polycrystalline silicon on the field oxide region; and protecting a region of the polycrystalline silicon to be a resistor and introducing impurity into two spaced apart regions of the polycrystalline silicon to thereby provide electrical connections to the resistor.

24. In a structure having a semiconductor substrate of first conductivity type, an epitaxial layer of second conductivity type, and a buried layer of second conductivity type separating the substrate from the epitaxial layer, a method of fabricating both bipolar and field effect transistors comprising:

removing all of the epitaxial layer and all of the buried layer from first regions where first channel type field effect transistors are desired to thereby leave second regions of the epitaxial layer and buried layer having sidewalls protruding above the substrate;

forming a layer of insulating material at least over the sidewalls of the second regions;

depositing semiconductor material over at least the first regions to thereby reform the epitaxial layer over the first regions, the epitaxial layer in the second regions being separated from the epitaxial layer in the first regions by the insulating material; and forming at least one first channel type field effect transistor in one of the second regions and one bipolar transistor in one of the first regions.

* * * * *